(12) United States Patent
Weng (10) Patent No.: US 8,981,377 B2
(45) Date of Patent: Mar. 17, 2015

(54) SEMICONDUCTOR DEVICE AND METHOD OF MAKING THE SAME

(75) Inventor: Shou-Peng Weng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/447,295

(22) Filed: Apr. 16, 2012

(65) Prior Publication Data

US 2013/0049000 A1    Feb. 28, 2013

(30) Foreign Application Priority Data

Aug. 26, 2011    (TW) .............................. 100130708 A (51) Int. Cl.
*H01L 29/786* (2006.01)
*H01L 27/12* (2006.01)
*H01L 29/423* (2006.01)

(52) U.S. Cl.
CPC ...... *H01L 27/1251* (2013.01); *H01L 29/78618* (2013.01); *H01L 29/42384* (2013.01); *H01L 29/786* (2013.01)
USPC ............... 257/66; 257/49; 257/351; 257/369; 257/E27.06; 257/E21.411; 438/149; 438/155

(58) Field of Classification Search
CPC ............ H01L 29/78618; H01L 29/786; H01L 29/6675; H01L 29/78621
USPC ..................................... 257/49, 66
See application file for complete search history.

(56) References Cited

U.S. PATENT DOCUMENTS

| 5,814,539 | A * | 9/1998 | Nakazawa ..................... 438/163 |
| 6,211,533 | B1 * | 4/2001 | Byun et al. ..................... 257/59 |
| 6,429,485 | B1 * | 8/2002 | Ha et al. ........................ 257/351 |
| 6,713,329 | B1 | 3/2004 | Wagner |
| 7,935,581 | B2 * | 5/2011 | Hwang ........................... 438/149 |
| 2008/0153214 | A1 * | 6/2008 | Jung et al. ..................... 438/164 |
| 2008/0272376 | A1 * | 11/2008 | Arao et al. ...................... 257/72 |
| 2009/0002590 | A1 | 1/2009 | Kimura |
| 2009/0072867 | A1 * | 3/2009 | Yamaji et al. ................... 327/77 |
| 2009/0184321 | A1 * | 7/2009 | Tsai et al. ....................... 257/66 |
| 2009/0256147 | A1 * | 10/2009 | Kim et al. ....................... 257/43 |
| 2009/0302325 | A1 * | 12/2009 | Huh et al. ........................ 257/72 |
| 2010/0025676 | A1 * | 2/2010 | Yamazaki et al. ............... 257/43 |
| 2010/0117155 | A1 * | 5/2010 | Kitakado ....................... 257/368 |

FOREIGN PATENT DOCUMENTS

| CN | 101622715 A | 1/2010 |
| TW | 200917419 | 4/2009 |

* cited by examiner

*Primary Examiner* — Julia Slutsker
*Assistant Examiner* — Natalia Gondarenko
(74) *Attorney, Agent, or Firm* — Winston Hsu; Scott Margo (57) ABSTRACT

A semiconductor device and method of making the same are provided. The method of forming semiconductor device uses non-implant process to form doped layers, and thus is applicable for large-size display panel. The method of forming semiconductor device uses annealing process to reduce the resistance of the doped layers, which improves the electrical property of the semiconductor device. A first dielectric layer of the semiconductor device is able to protect a semiconductor layer disposed in a first region of the substrate from being damaged during the process, and an etching stop layer of the semiconductor device is able to protect the semiconductor layer disposed in a second region of the substrate from being damaged when defining second doped layers. The first dielectric layer and the etching stop layer are formed by the same patterned dielectric layer, thus no extra process is required, fabrication cost is reduced, and yield is increased.

10 Claims, 11 Drawing Sheets

SEMICONDUCTOR DEVICE AND METHOD OF MAKING THE SAME

BACKGROUND OF THE INVENTION

1. Field of the Invention

The present invention relates to a semiconductor device and method of making the same, and more particularly, to a method of forming semiconductor device that uses a non-implant process to form a semiconductor device with low resistant doped layers.

2. Description of the Prior Art

Compared with amorphous silicon thin film transistor device, polycrystalline silicon thin film transistor device exhibits superior electrical property due to its high electrical mobility. As low temp polycrystalline silicon (LTPS) process advances, some major issue, e.g. poor uniformity of large-size film, has been improved. Thus, LTPS process has been expected to be applied in large-size display panel fabrication. The conventional LTPS process, nevertheless, normally uses an ion implant process to form doped layers for reducing the contact resistance in the thin film transistor device. To introduce the ion implant apparatus into large-size display panel fabrication would result in many technique problems and high cost. Therefore, to seek an alternative method for forming low resistant doped layers has become one of the developing goals.

In addition, LTPS thin film transistor device may be N type thin film transistor device or P type thin film transistor device when different conductive types of doped layers are used. In the conventional LTPS process, when both N type thin film transistor device and P type thin film transistor device are required, a patterned N type doped semiconductor layer and a patterned P type doped semiconductor layer are formed respectively on the same substrate, which would cause damages to the polycrystalline layer. For example, if the N type doped semiconductor layer is formed subsequent to the P type doped semiconductor layer, the polycrystalline silicon layer of the N type thin film transistor device will be damaged twice by two etching processes. Accordingly, the device characteristic of the N type thin film transistor device will be deteriorated.

SUMMARY OF THE INVENTION

It is therefore one of the objectives of the present invention to provide a semiconductor device and method of making the same to avoid damage of the semiconductor layer, and to improve the electrical performance and yield of the semiconductor device.

According to a preferred embodiment, a semiconductor device is provided. The semiconductor device is disposed on a substrate having a first region and a second region. The semiconductor device includes a first thin film transistor device disposed in the first region, and a second thin film transistor device disposed in the second region. The first thin film transistor device includes a first semiconductor layer disposed on the substrate, two first doped layers disposed on the first semiconductor layer, a first dielectric layer disposed on the first semiconductor layer and the first doped layers, a first gate insulating layer disposed on the first dielectric layer, a first gate electrode disposed on the first gate insulating layer, and a first source electrode and a first drain electrode electrically connected to the first doped layers respectively. The second thin film transistor device includes a second semiconductor layer disposed on the substrate, two second doped layers disposed on the second semiconductor layer, an etching stop layer disposed between the second doped layers and covering the second semiconductor layer exposed by the second doped layers, a second gate insulating layer disposed on the second doped layers and the etching stop layer, a second gate electrode disposed on the second gate insulating layer, and a second source electrode and a second drain electrode electrically connected to the second doped layers respectively.

According to another preferred embodiment of the present invention, a method of forming semiconductor device is provided. The method of forming semiconductor device includes the following steps. A substrate having a first region and a second region is provided. A semiconductor layer is formed on the substrate. A doped layer is formed on the semiconductor layer, and the doped layer is patterned to form two first doped layers in the first region. A patterned dielectric layer is formed on the substrate, wherein the patterned dielectric layer includes a first dielectric layer disposed on the semiconductor layer of the first region and the first doped layers, and an etching stop layer disposed on the semiconductor layer of the second region. Another doped layer is formed on the semiconductor layer and the patterned dielectric layer. The another doped layer is patterned to form two second doped layers in the second region, and the semiconductor layer is patterned to form a first semiconductor layer in the first region and a second semiconductor layer in the second region. A gate insulating layer is formed on the substrate, wherein the gate insulating layer covers the second doped layers, the first dielectric layer and the etching stop layer. A first patterned conductive layer is formed on the gate insulating layer, wherein the first patterned conductive layer includes a first gate electrode disposed on the gate insulating layer of the first region, and a second gate electrode disposed on the gate insulating layer of the second region. A first source electrode and a first drain electrode electrically connected to the first doped layers respectively are formed in the first region, and a second source electrode and a second drain electrode electrically connected to the second doped layers respectively are formed in the second region.

The method of forming semiconductor device of the present invention uses a first dielectric layer to protect the semiconductor layer of the first region from being damaged, and uses an etching stop layer to protect the semiconductor layer of the second region from being damaged when patterning the second doped layers. The first dielectric layer and the etching stop layer are defined by the same patterned dielectric layer, and therefore no extra process is required. In addition, fabrication cost can be reduced, and yield can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
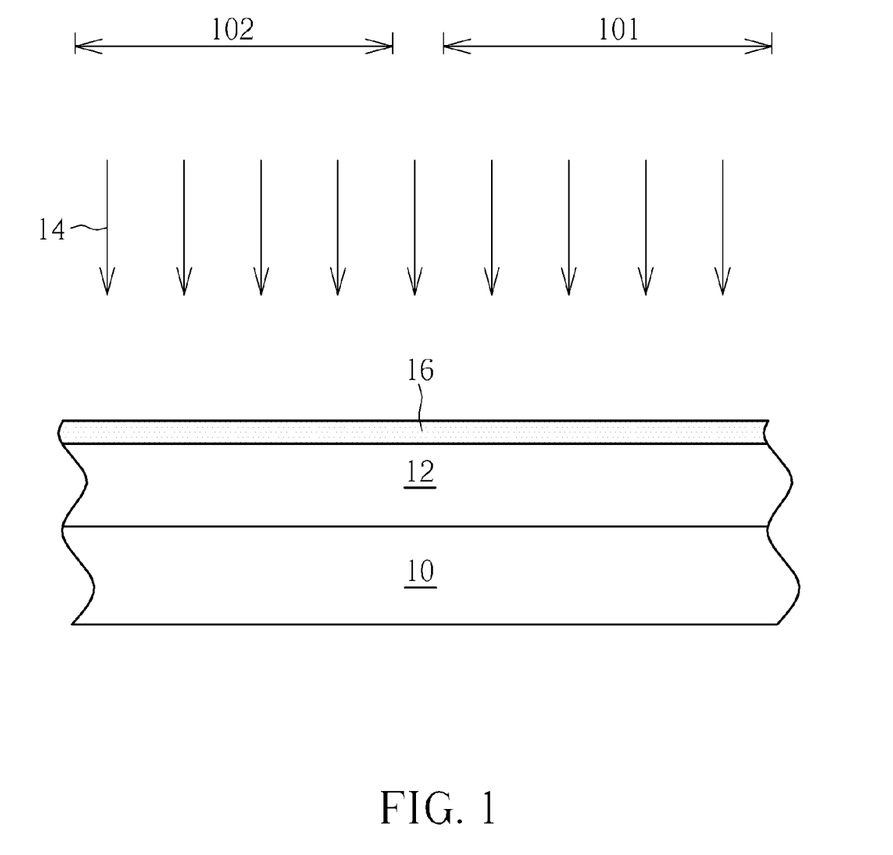
FIGS. 1-8 are schematic diagrams illustrating a method of forming semiconductor device according to a first preferred embodiment of the present invention.

Please refer to FIGS. 1-8. FIGS. 1-8 are schematic diagrams illustrating a method of forming semiconductor device according to a first preferred embodiment of the present invention. As shown in FIG. 1, a substrate 10 is provided. The substrate 10 may be a glass substrate, a plastic substrate or a quartz substrate, but not limited thereto. The substrate 10 has a first region 101 and a second region 102. Then, a semiconductor layer 12 is formed on the substrate 10. Subsequently, a doped layer 16 is formed on the semiconductor layer 12. In this embodiment, the semiconductor layer 12 may be an amorphous silicon layer, and an annealing process 14 may be carried out to convert the amorphous silicon layer into a polycrystalline silicon layer. The annealing process may be a laser annealing process, but not limited thereto. For example, the annealing process 14 may also be a thermal process. In this embodiment, the doped layer 16 is a P type doped semiconductor layer, but not limited thereto. The doped layer 16 can be formed by performing a non-implant process e.g. a chemical vapor deposition process, a physical vapor deposition process, a spin-on coating process, etc., along with introducing P type doped semiconductor material e.g. boron or boron compound during the non-implant process, but not limited thereto. After the doped layer 16 is formed, an annealing process 14 e.g. a laser annealing process can be performed to reduce the resistance of the doped layer 16. The annealing process 14 for converting the amorphous silicon layer into a polycrystalline silicon layer and the annealing process 14 for reducing the resistance of the doped layer 16 can be integrated. In other words, after the doped layer 16 is formed, one annealing process 14 can be performed to convert the amorphous silicon layer into a polycrystalline silicon layer, as well as reduce the resistance of the doped layer 16. The material of the semiconductor layer 12 is not limited to amorphous silicon, and may be other semiconductor material.

Figure 2:
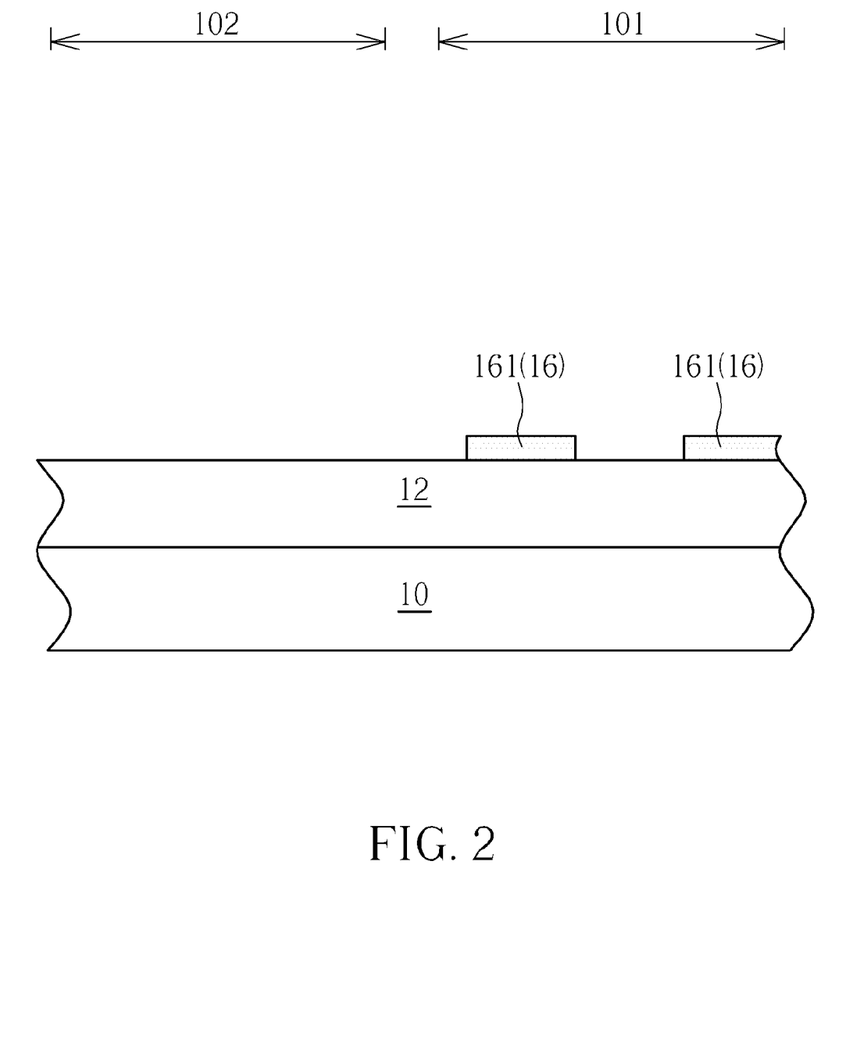
Figure 3:
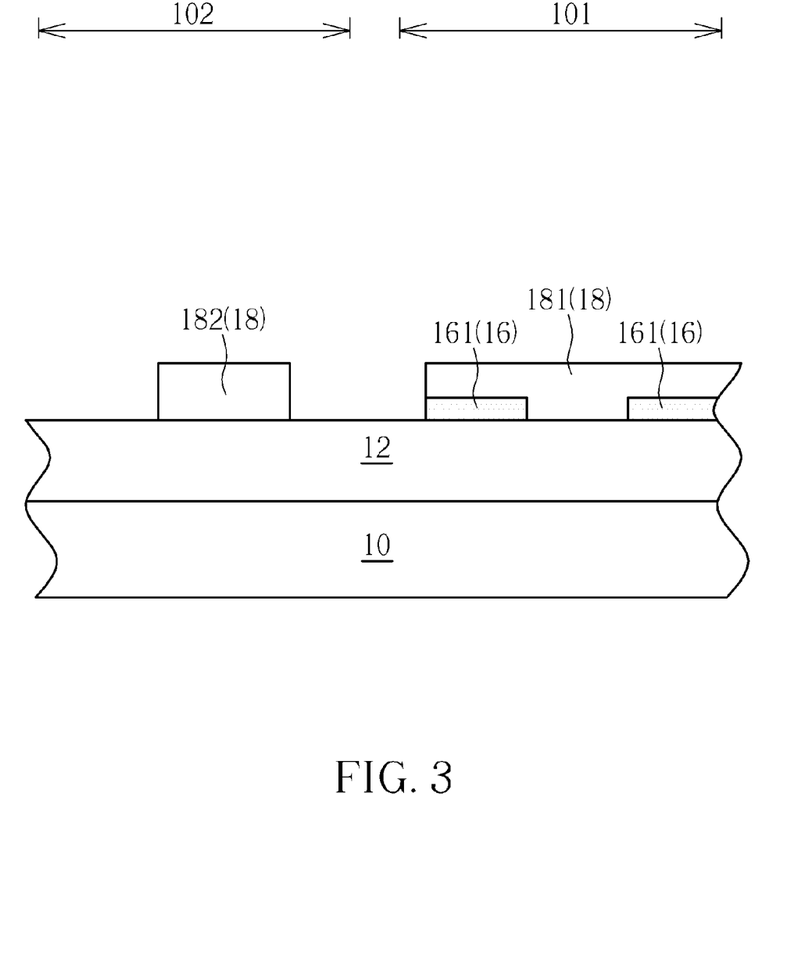

As shown in FIG. 2, the doped layer 16 is then patterned, for example by performing a lithography and etching process to form two first doped layers 161 in the first region 101. In this embodiment, the first doped layers 161 are P type doped semiconductor layers. As shown in FIG. 3, a patterned dielectric layer 18 is formed on the substrate 10 and the first doped layers 161. The patterned dielectric layer 18 includes a first dielectric layer 181 disposed on the semiconductor layer 12 and the first doped layers 161 in the first region 101, and an etching stop layer 182 disposed on the semiconductor layer 12 in the second region 102. The first dielectric layer 181 and a first gate insulating layer (not shown) to be formed subsequently are used as a gate insulating layer for protecting the semiconductor layer 12 in the first region 101 from being damaged in the successive process. The etching stop layer 182 is used as an etching stop layer for protecting the semiconductor layer 12 in the second region 102 from being damaged when patterning second doped layers in the successive process. The first dielectric layer 181 and the etching stop layer 182 are made of the same patterned dielectric layer 18, and thus no extra process is required. The material of the patterned dielectric layer 18 may be various types of dielectric materials such as silicon oxide, silicon nitride or silicon oxynitride, but not limited thereto. In addition, the patterned dielectric layer 18 may be a single-layered dielectric structure or a composite-layered dielectric structure.

Figure 4:
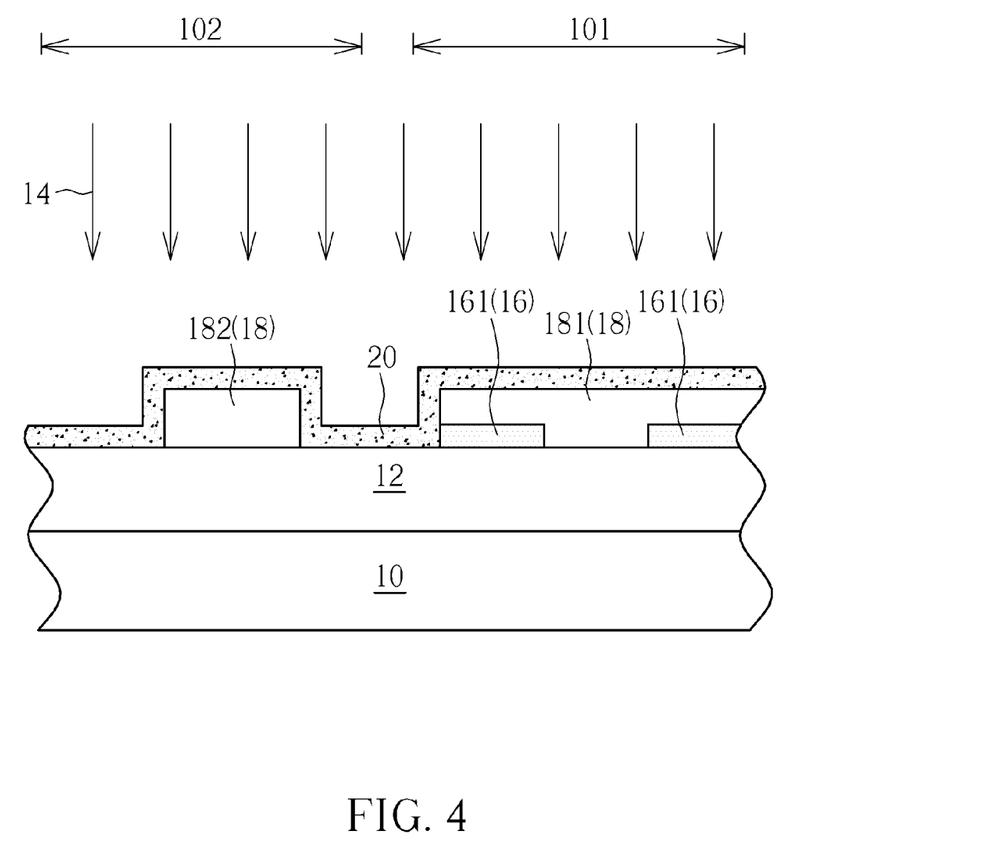
Figure 5:
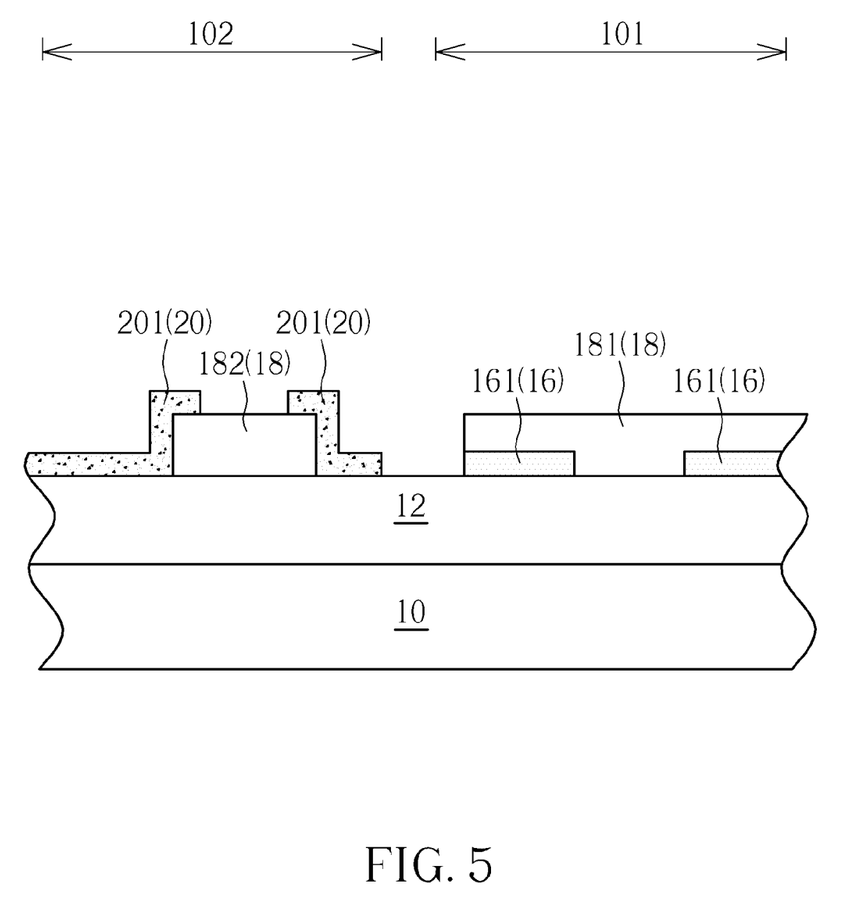

As shown in FIG. 4, another doped layer 20 is formed on the semiconductor layer 12 and the patterned dielectric layer 18. In this embodiment, the doped layer 20 is an N type doped semiconductor layer, but not limited thereto. The doped layer 20 can be formed by performing a non-implant process e.g. a chemical vapor deposition process, a physical vapor deposition process, a spin-on coating process, etc., along with introducing N type doped semiconductor material e.g. phosphorus or phosphorus compound during the non-implant process, but not limited thereto. After the doped layer 20 is formed, an annealing process 14 e.g. a laser annealing process can be performed to reduce the resistance of the doped layer 20. The annealing process 14 for converting the amorphous silicon layer into a polycrystalline silicon layer and the annealing process 14 for reducing the resistance of the doped layer 16 can be integrated with the annealing process 14 for reducing the resistance of the doped layer 20. In other words, after the doped layer 20 is formed, one annealing process 14 can be performed to convert the amorphous silicon layer into a polycrystalline silicon layer, as well as reduce the resistance of the doped layer 16 and the doped layer 20. As shown in FIG. 5, a lithography and etching process, for example, is performed to form a photo resist pattern (not shown) on the doped layer 20, and the doped layer 20 is etched to form two second doped layers 201 in the second region 102. In this embodiment, the etching stop layer 182 is disposed between the second doped layers 201, and the second doped layers 201 may partially cover the etching stop layer 182, but not limited. For example, the second doped layers 201 may be disposed on two opposite sides of the etching stop layer 182 without covering the etching stop layer 182. The second doped layers 201 are N type doped semiconductor layers. The etching stop layer 182 are disposed on the semiconductor layer 12 in the second region 102, and thus the semiconductor layer 12 in the second region 102 would not be damaged when patterning the doped layer 20. Subsequently, the photo resist pattern is removed.

Figure 6:
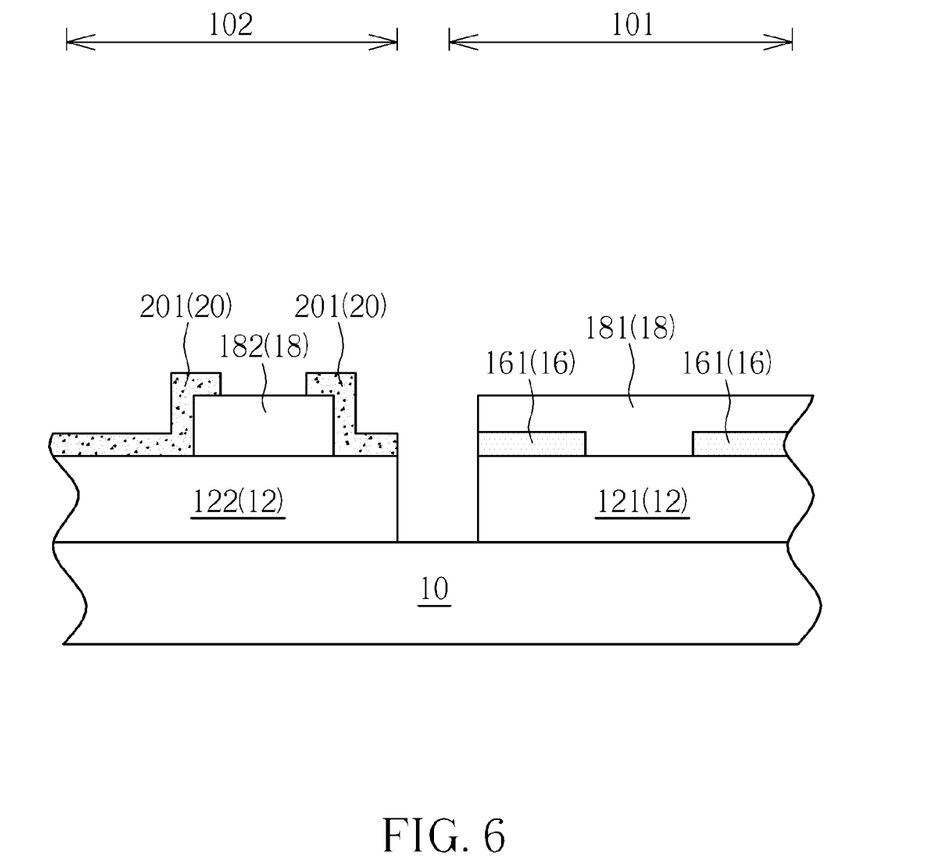
Figure 7:
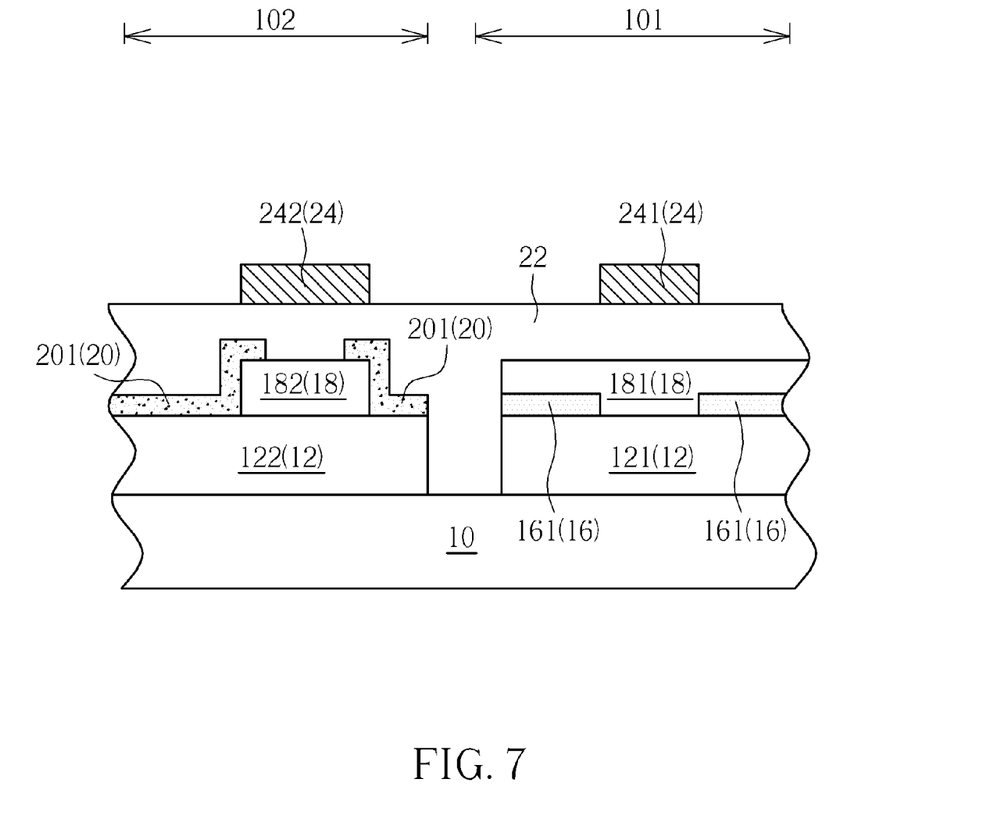

As shown in FIG. 6, the second doped layers 201, the etching stop layer 182 and the first dielectric layer 181 are used as an etching mask to pattern the semiconductor layer 12, thereby forming a first semiconductor layer 121 in the first region 101, and a second semiconductor layer 122 in the second region 102. The method of patterning the semiconductor layer 12 is not limited by the aforementioned method. In an alternative embodiment, for instance, the photo resist pattern for defining the doped layer 20 may be reserved until the semiconductor layer 12 is patterned, such that the second doped layers 201 can be protected from being damaged when etching the semiconductor layer 12. As shown in FIG. 7, a gate insulating layer 22 is formed on the substrate 10 to cover the second doped layers 201, the first dielectric layer 181 and the etching stop layer 182. The material of the gate insulating layer 22 may be various types of dielectric materials such as silicon oxide, silicon nitride or silicon oxynitride, but not limited thereto. The gate insulating layer 22 may be a single-layered dielectric structure or a composite-layered dielectric structure. Subsequently, a first patterned conductive layer 24 is formed on the gate insulating layer 22. The first patterned conductive layer 24 includes a first gate electrode 241 disposed on the gate insulating layer 22 in the first region 101, and a second gate electrode 242 disposed on the gate insulating layer 22 in the second region 102. The material of the first patterned conductive layer 24 may be metal or other conductive materials.

Figure 8:
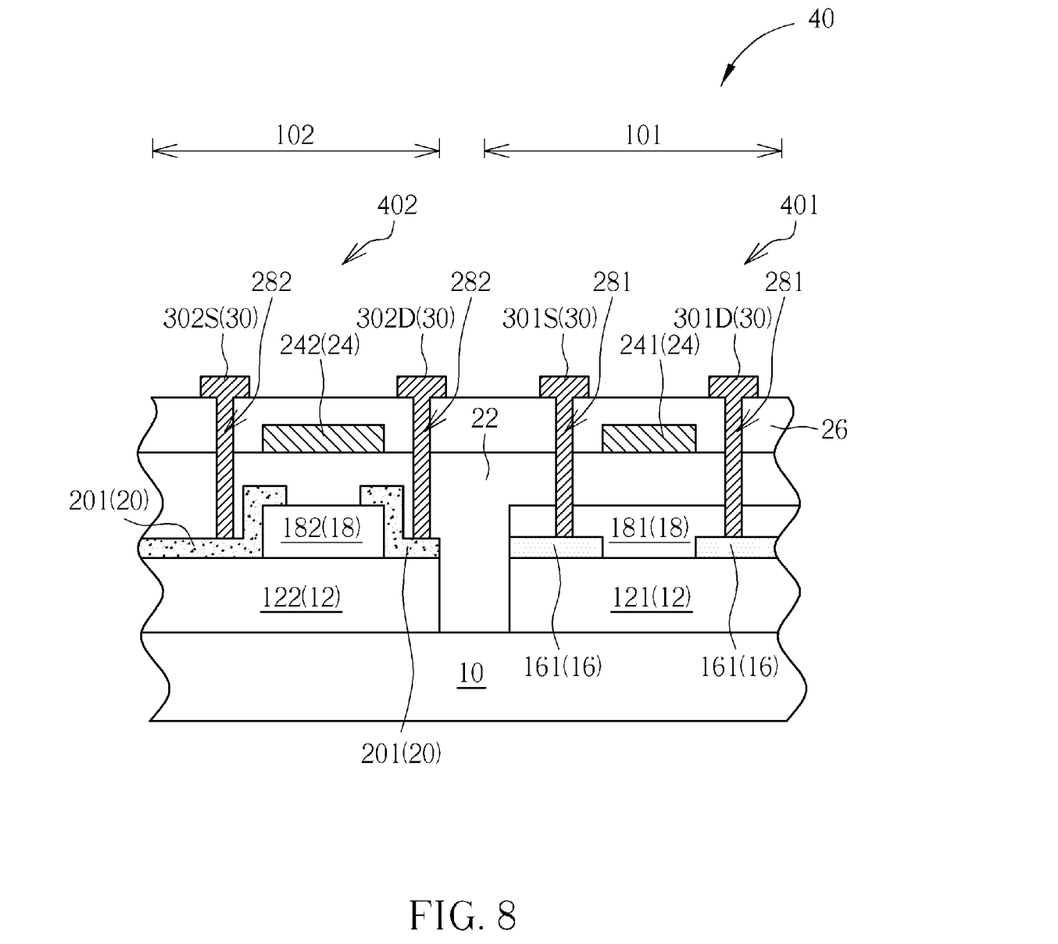

As shown in FIG. 8, at least one inter-layered dielectric (ILD) 26 is formed on the gate insulating layer 22, the first gate electrode 241 and the second gate electrode 242. The material of the ILD 26 may be various types of dielectric materials such as silicon oxide, silicon nitride or silicon oxynitride, but not limited thereto. Then, a plurality of first contact holes 281 are formed in the ILD 26, the gate insulating layer 22 and the first dielectric layer 181 in the first region 101 to partially expose each of the first doped layers 161 respectively, and a plurality of second contact holes 282 are formed in the ILD 26 and the gate insulating layer 22 in the second region 102 to partially expose each of the second doped layers 201 respectively. Subsequently, a second patterned conductive layer 30 is formed on the ILD 26. The second patterned conductive layer 30 includes a first source electrode 301S and a first drain electrode 301D disposed on the ILD 26 in the first region 101 and electrically connected to each of the first doped layers 161 respectively, and a second source electrode 302S and a second drain electrode 302D disposed on the ILD 26 in the second region 102 and electrically connected to each of the second doped layers 201 respectively. The material of the first source electrode 301S, the first drain electrode 301D, the second source electrode 302S and the second drain electrode 302D may be metal or other conductive materials. By virtue of the aforementioned method, a semiconductor device 40 of this embodiment is accomplished. In the first region 101, the first semiconductor layer 121, the first doped layers 161, the first dielectric layer 181, the gate insulating layer 22, the first gate electrode 241, the ILD 26, the first source electrode 301S and the first drain electrode 301D form a first thin film transistor device 401. In the second region 102, the second semiconductor layer 122, the etching stop layer 182, the second doped layers 201, the gate insulating layer 22, the second gate electrode 242, the ILD 26, the second source electrode 302S and the second drain electrode 302D form a second thin film transistor device 402.

The semiconductor device and method of making the same are not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 9:
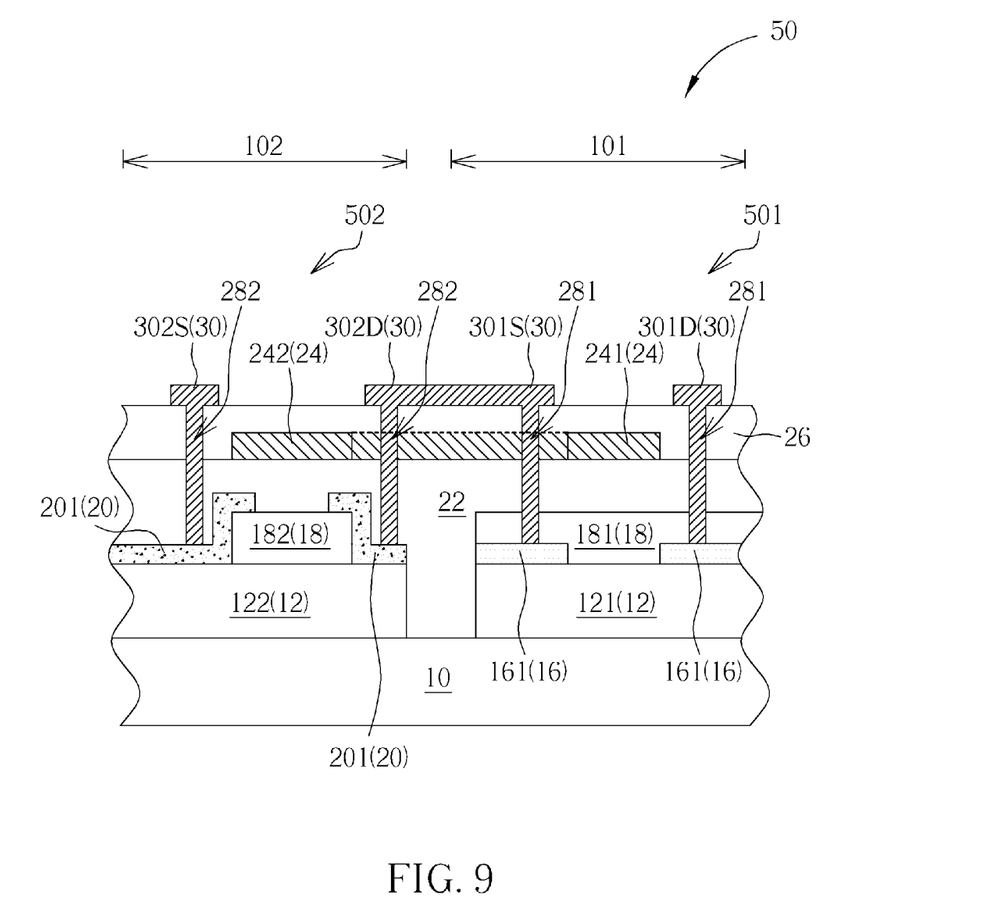
FIG. 9 is a schematic diagram illustrating a method of forming semiconductor device according to a second preferred embodiment of the present invention.

Please refer to FIG. 9, as well as FIGS. 1-8. FIG. 9 is a schematic diagram illustrating a method of forming semiconductor device according to a second preferred embodiment of the present invention. As shown in FIG. 9, different from the aforementioned embodiment, in this embodiment, the first gate electrode 241 of the first thin film transistor device 501 is electrically connected to the second gate electrode 242 of the second thin film transistor device 502, and the first source electrode 301S and the second drain electrode 302D are electrically connected. The semiconductor device 50 of this embodiment may be a CMOS device, but not limited thereto. The first gate electrode 241 and the second gate electrode 242 may be electrically connected directly, or with another bridging structure. The first source electrode 301S and the second drain electrode 302D may be electrically connected directly, or with another bridging structure. The semiconductor device 50 may be applied in the peripheral circuit of electroluminescent display panel, but not limited thereto.

Figure 10:
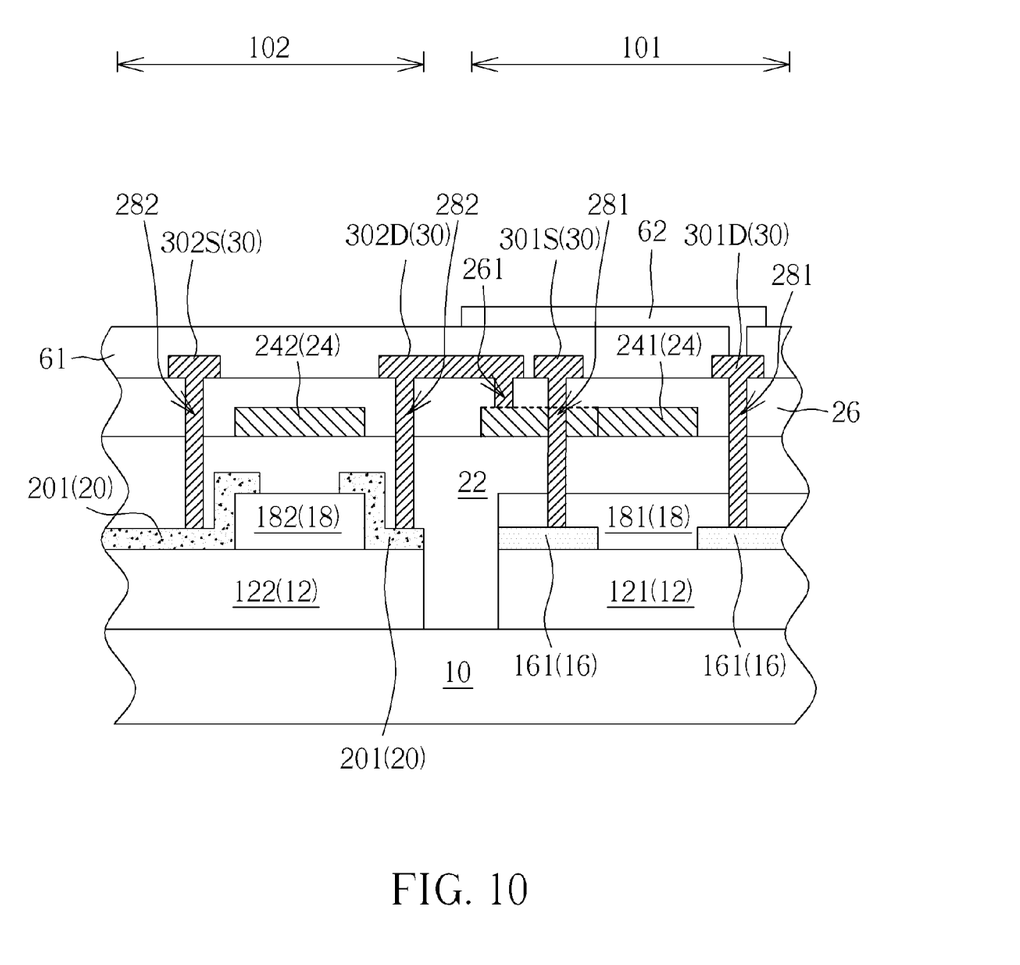
FIGS. 10-11 are schematic diagrams illustrating a method of forming semiconductor device according to a third preferred embodiment of the present invention.
Figure 11:
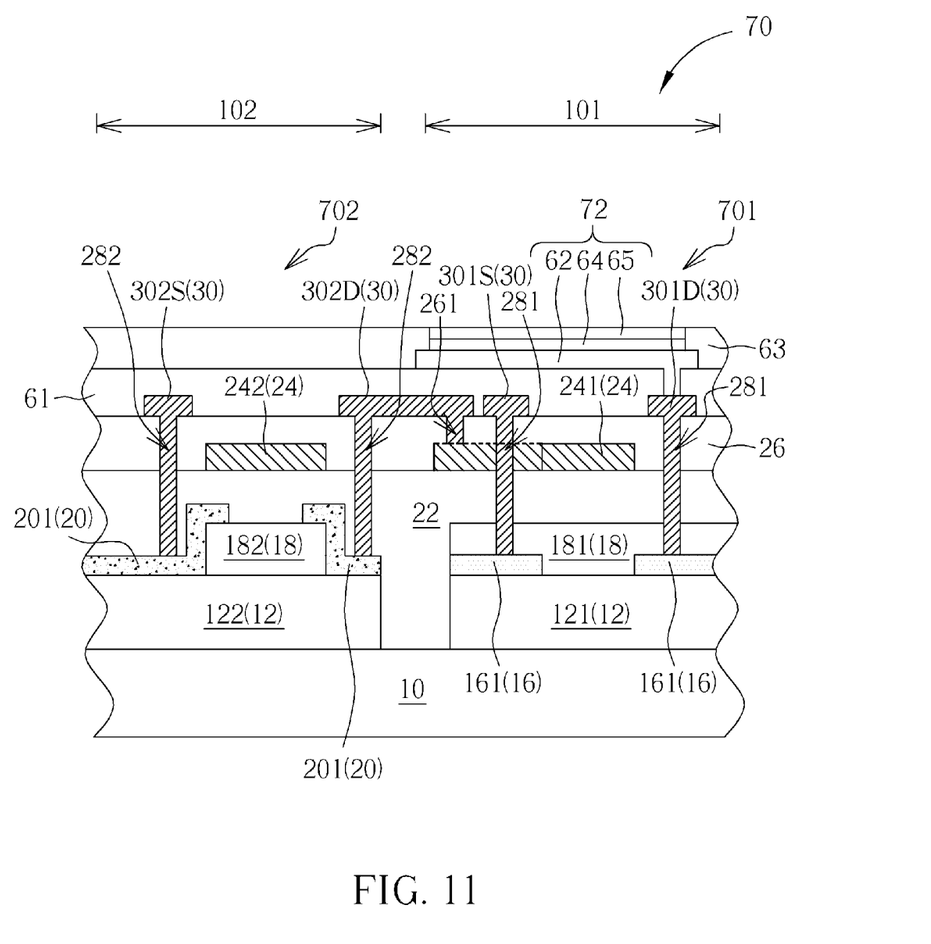

Please refer to FIGS. 10-11, as well as FIGS. 1-8. FIGS. 10-11 are schematic diagrams illustrating a method of forming semiconductor device according to a third preferred embodiment of the present invention. As shown in FIG. 10, in this embodiment, the first gate electrode 241 is electrically connected to the second drain electrode 302D. For instance, the second drain electrode 302D is electrically connected to the first gate electrode 241 through the contact hole 261 of the ILD 26. Then, a first passivation layer 61 is formed on the ILD 26, the first source electrode 301S, the first drain electrode 301D, the second source electrode 302S and the second drain electrode 302D. The first passivation layer 61 at least partially exposes the first drain electrode 301D. Subsequently, a first electrode 62 is formed on the first passivation layer 61 to electrically connect with the exposed first drain electrode 301D.

As shown in FIG. 11, a second passivation layer 63 is formed on the first passivation layer 61 and the first electrode 62. The second passivation layer 63 at least partially exposes the first electrode 62. A light-emitting layer 64 and a second electrode 65 are then formed on the first electrode 62 exposed by the second passivation layer 63 to accomplish a semiconductor device 70 of this embodiment. The semiconductor device 70 may be applied in the pixel structure of electroluminescent display panel. The first thin film transistor device 701 may serve as a driving thin film transistor device, the second thin film transistor device 702 may serve as a switching thin film transistor device, and the first electrode 62, the light-emitting layer 64 and the second electrode 65 form a light-emitting device 72, but not limited thereto. Also, in this embodiment, the first electrode 62 is an anode, and the second electrode is a cathode, but not limited thereto.

In conclusion, the method of forming semiconductor device of the present invention uses a non-implant process to form the doped layers, which is applicable in large-size display panel fabrication. The resistance of the doped layers is reduced by an annealing process, and thus the electrical characteristic of the semiconductor device is improved. In addition, the first dielectric layer of the semiconductor device is able to protect the semiconductor layer in the first region from being damaged, and the etching stop layer is able to protect the semiconductor layer from being damaged when defining the second doped layer. The first dielectric layer and the etching stop layer are defined by the same patterned dielectric layer. Accordingly, no extra process is required, fabrication cost is reduced, and yield is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, disposed on a substrate, the substrate having a first region and a second region, the semiconductor device comprising:
　a first thin film transistor device, disposed in the first region, the first thin film transistor device comprising:
　　a first semiconductor layer, disposed on the substrate, wherein the first semiconductor layer has a sidewall;
　　two first doped layers, disposed on the first semiconductor layer, wherein each of the first doped layers has an inner sidewall and an outer sidewall, and a portion of the first semiconductor layer disposed between the first doped layers is not covered by the first doped layers;
　　a first dielectric layer, disposed on the first semiconductor layer and the first doped layers, wherein the first dielectric layer is in contact with the portion of the first semiconductor layer not covered by the first doped layers and in contact with the inner sidewall of each of the first doped layers, and the first dielectric layer has a top surface and a sidewall;
　　a first gate insulating layer, disposed on the first dielectric layer, wherein the first gate insulating layer is in contact with the sidewall of the first semiconductor layer, the outer sidewall of each of the first doped layers, and the top surface and the sidewall of the first dielectric layer;

a first gate electrode, disposed on the gate insulating layer, wherein the first gate electrode has a bottom surface, and the first gate insulating layer is in contact with the bottom surface of the first gate electrode; and a first source electrode and a first drain electrode, electrically connected to the first doped layers, respectively; and a second thin film transistor device, disposed in the second region, the second thin film transistor device comprising:

a second semiconductor layer, disposed on the substrate, wherein the second semiconductor layer has a sidewall;

an etching stop layer, disposed on the second semiconductor layer, wherein the etching stop layer partially covers a top surface of the second semiconductor layer, and the etching stop layer has a top surface;

two second doped layers, disposed on the second semiconductor layer, wherein the second doped layers cover the top surface of the second semiconductor layer not covered by the etching stop layer, and each of the second doped layers has an inner sidewall and an outer sidewall;

a second gate insulating layer, disposed on the second doped layers and the etching stop layer, wherein the second gate insulating layer is in contact with the sidewall of the second semiconductor layer, the inner sidewall and the outer sidewall of each of the second doped layers, and a portion of the top surface of the etching stop layer;

a second gate electrode, disposed on the second gate insulating layer, wherein the second gate electrode has a bottom surface, the second gate insulating layer is in contact with the bottom surface of the second gate electrode, and the first gate insulating layer is a continuous layer with the second gate insulating layer; and a second source electrode and a second drain electrode, electrically connected to the second doped layers, respectively.

2. The semiconductor device of claim 1, wherein the first doped layers comprise P type doped semiconductor layers, and the second doped layers comprise N type doped semiconductor layers.

3. The semiconductor device of claim 1, wherein the first doped layers and the second doped layers comprise non-implant doped layers.

4. The semiconductor device of claim 1, wherein the first semiconductor layer and the second semiconductor layer comprise polycrystalline silicon layers.

5. The semiconductor device of claim 1, further comprising at least one inter-layered dielectric (ILD), disposed on the first gate insulating layer, the second gate insulating layer, the first gate electrode and the second gate electrode.

6. The semiconductor device of claim 5, wherein the at least one ILD, the first gate insulating layer and the first dielectric layer further have a plurality of first contact holes partially exposing each of the first doped layers respectively, the first source electrode and the first drain electrode are disposed on the ILD and electrically connected to each of the first doped layers through the first contact holes respectively, the at least one ILD and the second gate insulating layer further have a plurality of second contact holes partially exposing each of the second doped layers respectively, and the second source electrode and the second drain electrode are disposed on the ILD and electrically connected to each of the second doped layers through the second contact holes respectively.

7. The semiconductor device of claim 1, wherein the first source electrode is electrically connected to the second drain electrode, and the first gate electrode is electrically connected to the second gate electrode.

8. The semiconductor device of claim 1, wherein the first gate electrode is electrically connected to the second drain electrode.

9. The semiconductor device of claim 8, further comprising a light-emitting device, wherein the light-emitting device comprises a first electrode, a light-emitting layer and a second electrode, and the first electrode is electrically connected to the first drain electrode of the first thin film transistor device.

10. The semiconductor device of claim 1, wherein the first dielectric layer and the etching stop layer belong to a same patterned dielectric layer.

* * * * *